United States Patent [19]

Mizunoya et al.

[11] Patent Number: 4,954,386
[45] Date of Patent: Sep. 4, 1990

[54] JOINED CERAMIC-METAL COMPOSITE SUBSTRATE AND METHOD FOR PRODUCTION THEREOF

[75] Inventors: Nobuyuki Mizunoya; Hiroshi Komorita, both of Kanagawa; Tadashi Tanaka, Chiba; Kazuo Matsumura, Kanagawa, all of Japan

[73] Assignee: Kabushiki Kaisha Toshiba, Kanagawa, Japan

[21] Appl. No.: 281,365

[22] Filed: Dec. 8, 1988

[30] Foreign Application Priority Data

Dec. 18, 1987 [JP] Japan .................................. 62-320741

[51] Int. Cl.$^5$ ............................................... B32B 3/00
[52] U.S. Cl. ................................... 428/137; 428/192; 428/209; 428/210; 428/426; 428/433; 428/457; 428/901; 174/258; 361/397; 361/414; 228/124; 228/174; 228/198
[58] Field of Search ............... 428/137, 192, 209, 210, 428/426, 433, 457, 901; 427/96; 174/68.5; 361/397, 414; 228/129, 174, 198

[56] References Cited

U.S. PATENT DOCUMENTS

| 171,451 | 3/1888 | Matsumura et al. | |
| 3,826,629 | 7/1972 | Pryor, Jr. et al. | 428/469 |
| 4,409,278 | 10/1983 | Jochym | |
| 4,608,321 | 8/1986 | Sato et al. | 428/632 |
| 4,739,443 | 4/1988 | Singhdeo | 361/414 |

FOREIGN PATENT DOCUMENTS 0219254 4/1987 European Pat. Off. .

Primary Examiner—Patrick Ryan
Attorney, Agent, or Firm—Finnegan, Henderson, Farabow, Garrett, and Dunner

[57] ABSTRACT

A joined ceramic-metal composite substrate having a copper sheet directly joined to a ceramic substrate and a method for the production thereof. The composite substrate is characterized by having at least one through hole in the copper sheet which is connected to at least one groove formed at a distance from the edge of the copper sheet on the surface of the copper sheet to be joined to the ceramic substrate.

11 Claims, 2 Drawing Sheets

JOINED CERAMIC-METAL COMPOSITE SUBSTRATE AND METHOD FOR PRODUCTION THEREOF

BACKGROUND OF THE INVENTION

This invention relates to a joined ceramic-metal composite substrate having a copper sheet directly joined to a ceramic substrate and a method for the production thereof.

In recent years, DBC (Direct Bonded Copper) substrates have been developed for ceramic circuit boards which are intended for substrates for ceramic circuit boards which are intended for substrates in transistor modules, for example. They are obtained by disposing a copper sheet at a stated position on a ceramic substrate and directly joining the sheet and the substrate by heating. The heating is carried out at a temperature not exceeding the melting point of copper (1,083° C.) and exceeding the eutectic point of copper and oxygen (1,065° C.). The copper sheet is later formed into conductor circuits.

In the DBC substrate, the ceramic substrates are heavily warped or deformed during the application of heat. Consequently, gas emanating from the ceramic substrates or copper sheets is entrapped in the interfaces between the ceramic substrates and copper sheets, and the copper sheets sustain fine blisters in portions thereof, or portions of insufficient union are produced in the composites. When these blisters grow to a size exceeding a certain level, they create a problem in that the DBC substrates will not permit silicon semiconductor chips to be easily mounted thereon and consequently the yield of the products is poor. There is another problem in that even when the chips can be mounted, the chips have poor adhesion and suffer from inferior thermal conductivity.

Jochym (USP 4,409,278Z) has disclosed a directly joined metal-substrate composite which has venting channels between the contiguous surfaces of the metal sheet and the substrate. This construction evidently prevents the occurrence of blisters in the interface. However, it was found by the present inventors that even if this kind of construction is used in such a composite substrate, it does not often provide highly satisfactory thermal conductivity. This is because such construction permits the etching liquid and liquid material such as soldering flux to enter into the grooves in the mounting process, and such liquid prevents the interface between the copper sheet and the ceramic substrate from having good adhesion. It is a problem when such substrate has poor thermal conductivity. This is because thermal conductivity is important for these substrates to effectively dissipate heat from silicon chips.

SUMMARY OF THE INVENTION

This invention has been produced for the solution of the above problems. An object of this invention is to provide a joined ceramic-metal composite substrate which can be produced in high yield without the occurrence of blisters in the interface. Another object of this invention is to provide a joined ceramic-metal composite substrate enjoying highly satisfactory thermal conductivity and enabling subsequent treatments such as the mounting of a chip thereon to be carried out without any noteworthy trouble. To be more specific, this invention is directed to a joined ceramic-metal composite substrate comprising a ceramic substrate having opposite surfaces and a copper sheet having a face directly joined to one of the surfaces of the ceramic substrate, at least one hole through the copper sheet, and at least one groove on the face of the copper sheet, the face including an area surrounding the face free from the grooves.

The method for producing the ceramic circuit substrate according to this invention comprises, the steps of disposing a prescribed shaped copper circuit board having many grooves formed in its one side to have its grooved side contacted with the ceramic substrate, and bonding the substrate and the board by heat treating.

The copper circuit board used for the ceramic circuit substrate according to this invention is formed with many grooves at a prescribed distance from each edge in each copper sheet, in other words excluding a prescribed width from each edge, and at least one through hole to which each groove is connected is formed in the copper sheet.

Thus, forming the grooves as above can prevent the etching liquid and liquid material such as soldering flux from entering into the grooves in the mounting process, if the through hole is covered by resin. This is because such a through hole or the copper sheet can be covered easily and steadily.

Forming the grooves as above can also prevent the composite substrate from having blisters in the interface. This is because the gas entrapped in the interface can be taken away through such grooves connected to the through hole.

DESCRIPTION OF THE PREFERRED EMBODIMENTS

Reference will now be made in detail to the present preferred embodiments of the invention, examples of which are illustrated in the accompanying drawings. In accordance with the invention, the joined ceramic-metal composite substrate comprises a ceramic substrate and a copper sheet joined to at least one surface of the substrate. The copper sheet has at least one groove on the surface thereof. At least one through hole is formed to be connected to each groove of the copper sheet. This through hole works as a gas vent hole, making it possible to prevent the bonded portion from swelling. The through hole should have a diameter on the order of about 0.2 mm to 1.0 mm and should be formed in a place where it will not interface with mounting. This through hole can be formed by etching or by any known mechanical method.

The grooves preferably should be formed in a large number and in parallel. These grooves should have a width in the range of about 0.01 to 3 mm, preferably 0.5 to 1 mm, and a maximum depth of 0.1 mm or one half of the thickness of the copper sheet whichever is less. Preferably, the depth is between 0.02 mm and 0.08 mm. These grooves should be separated by a fixed pitch, i.e. the distance between the center lines of the adjacent grooves, falling in the range of 1 to 25 mm.

The width where such grooves are not formed on the copper sheet is preferred to be at least about 1 mm from each edge of the copper sheet.

The grooves are formed in the copper circuit substrate by the methods described hereinbelow.

Figure 1:
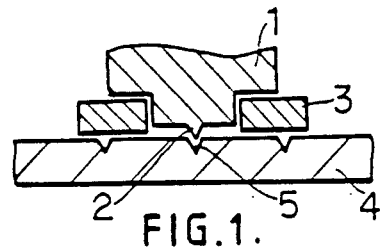
FIG. 1 is a sectional view of a copper sheet with a metal mold having a V-shaped projection for forming the grooves.

(1) As shown in FIG. 1, a metal mold I has projections 2 thereon. Pressing with the metal mold 1 is effected with the depth of grooves adjusted according to the thickness of a stopper 3, thereby forming grooves 5 to a prescribed depth in a copper member 4.

Figure 2:
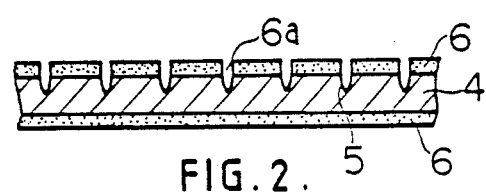
FIG. 2 is a sectional view of a copper sheet with grooves formed by etching.

(2) in FIG. 2, a masking film 6 is formed on both sides of a copper member 4. A portion 6a corresponds to a desired groove forming position on one side of the member 4. The masking film in the portion 6a is removed. Then the copper member 4 is etched to form grooves 5.

Figure 3:
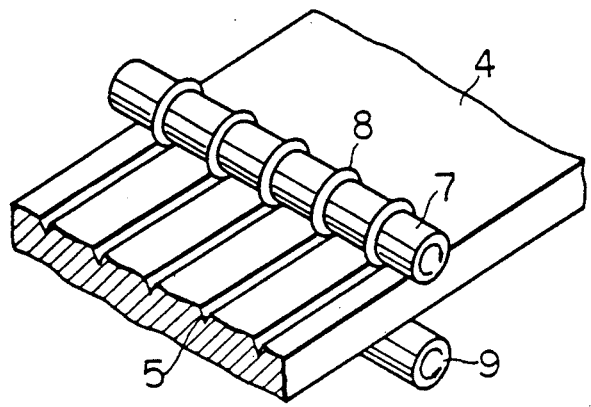
FIG. 3 is a perspective illustration showing a roller forming the grooves.

(3) As shown in FIG. 3, a pressure roll 7 has projections 8 on its outer periphery. A copper member 4 is rolled between this roll and a rider roll 9 to form grooves 5.

In the above methods (1) through (3), the method (1) can form the grooves to a prescribed depth even if the copper member varies in thickness because the depth of the grooves is adjusted by the stopper; the method (2) is suitable for the production of a prototype and in a small lot because it does not need a metal mold and other facilities; and the method (3) is suitable to form the grooves collectively by using a strip material as the copper member. Moreover, the grooves produced by the above methods (1) and (3) (the grooves produced through plastic deformation) are flattened out to some extent by the heat used during the course of the joining. At the time that the copper sheet having the grooves formed thereon is joined to the ceramic substrate, the oxygen evolved from the copper sheet finds its way out through these grooves. At the same time, the grooves produced through plastic deformation are recovered and eventually flattened out to some extent by the intense heat used during the course of the joining. As a result, the gap between the ceramic substrate and the copper sheet decreases. For this reason, the ceramic-copper composite substrate produced by the above methods (1) and (3) has higher thermal conductivity than one produced by the above method (2).

These methods are selectively used according to their characteristics. The grooves also may be formed to run radially from the through hole.

The copper sheet to be used is preferably made of oxygen-free copper or tough pitch copper having an oxygen content in the range of 100 to 2000 ppm, preferably 200 to 500 ppm. The practical thickness of the copper sheet is in the range of 0.03 to 0.5 mm. The ceramic substrates used in this invention include those made from alumina, beryllia and other oxide-based sintered ceramics, and aluminum nitride, silicon nitride, titanium nitride, silicon carbide, and other non-oxide based sintered ceramics. When a non-oxide based ceramic substrate is used, the bonding faces are preferably subjected to an oxidizing treatment in advance.

To preclude the occurrence of blisters, the warp possibly inflicted on the ceramic substrate is desired to be not more than 20 $\mu m$/50 mm. To obtain this range, it is desirable that the ceramic substrate be given a special polishing and then a wet honing in advance of bonding.

Union of the ceramic substrate to the copper sheet is carried out, for example, as follows.

The copper sheet is disposed at a stated position on the ceramic substrate. The components, as held in the superposed state, are heated in a non-oxidizing atmosphere or, when the copper sheet is made of oxygen-free copper, in an oxidizing atmosphere containing a very small amount of oxygen, at a temperature in a range of 1,065 to 1,083° C., and preferably 1,070 to 1,075° C. Suitably, the heating time is in a range of 2 to 30 minutes. After the heating thus conducted, the composite is cooled to complete the joined ceramic-metal composite.

EXAMPLE (1)

Now, one embodiment of this invention will be described below.

Figure 4A:
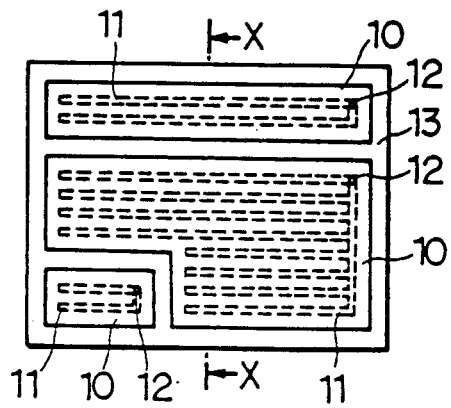
FIG. 4A is a plan view showing one side of the metal-ceramic composite substrate of one embodiment of this invention.
Figure 4B:
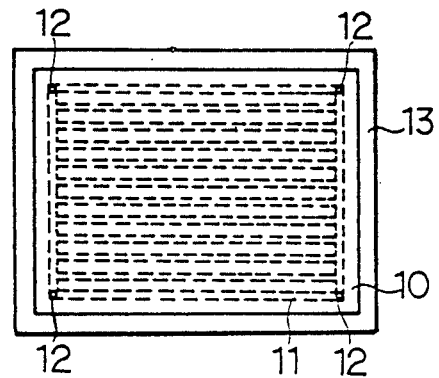
FIG. 4B is a plan view showing the opposite side of the metal-ceramic composite substrate in FIG. 4A.
Figure 4C:
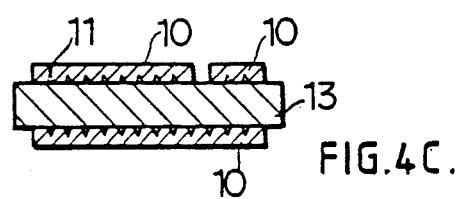
FIG. 4C is a cross section taken along line x—x of FIG.4A.

As shown in FIG. 4A and 4C, the front surface of a copper circuit board 10 bonded to a ceramic substrate 13 has a large number of V-grooves 11 in parallel formed to a width of 100 $\mu mm$ and depth of 30 $\mu m$ excepting an area 1 mm from the end of each copper sheet. These V-grooves II are connected to a through hole 12 having a diameter of about 0.5 mm. As shown in FIGS. 4B and 4C, the back surface of the circuit board 10 bonded to the ceramic substrate 13 is also formed with such V-grooves 11 and through hole 12 in the same way. This copper circuit board 10 is directly bonded to the ceramic substrate 13.

Such a ceramic circuit substrate is produced for example by the method described below.

First, with a metal mold 1 was provided V-shaped projections 2 as shown in FIG. 1. The depth of the V-grooves was adjusted with a stopper 4. Then a press molding was effected to form a large number of V-grooves 5 with a width of 100 $\mu m$ and a depth of 30 $\mu m$ excluding an area 1 mm from the edge the of prescribed circuit pattern of the copper member 4. Then, a punching die was used to cut the copper member into a prescribed shape and to form a through hole at the same time, thereby forming the copper circuit board 10 shown in FIG. 4. Next, the surface of the copper circuit board 10 in which the V-grooves 11 were formed was disposed in contact with ceramic substrate 13. Both were heated to be bonded together in an atmosphere of nitrogen gas at a temperature of 1070° C. for about 10 minutes so as to obtain a ceramic circuit substrate.

When the appearance of the ceramic circuit substrate thus obtained was inspected, very little swelling was observed and the surface ratio was equivalent to 2% or below. No entrance of the liquid material into the V-grooves was observed in the production process.

COMPARATIVE EXAMPLE (1)

For comparison, a comparative example (1) was conducted. A composite was used which had neither a through hole in the copper sheet nor an area free of grooves on each edge of the copper sheet.

The grooves of this comparative example are formed by etching. When the appearance of the ceramic circuit substrate thus obtained was inspected, swelling caused the surface ratio to be only about 4%. Thus, high yield of product was obtained. However, the thermal conductivity of this product was too low. This was because the etching liquid and soldering flux entered into the grooves during the mounting process, and such liquid made poor adhesion in the interface between the copper sheet and the ceramic substrate.

COMPARATIVE EXAMPLE (2)

A comparative example (2) was conducted in which neither a through hole nor grooves were made the copper sheet. The occurrence of swelling in this example was equivalent to a surface ratio of about 10%.

EXAMPLE (2)

Figure 5A:
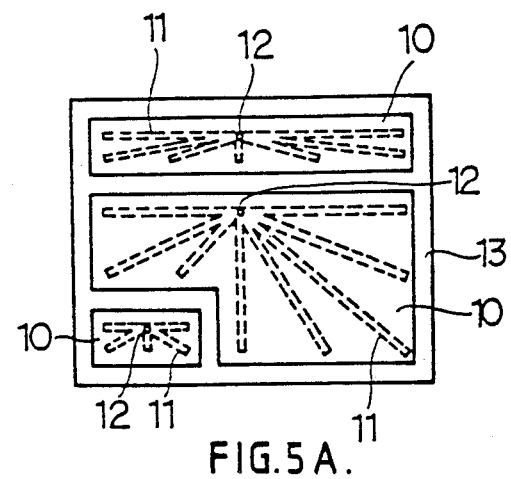
FIG. 5A is a plan view showing one surface the substrate of another embodiment of this invention.
Figure 5B:
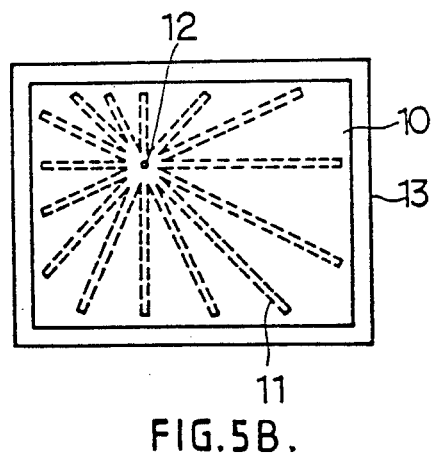
FIG. 5B is a plan view showing the opposite surface the substrate in FIG. 5A.

As shown in FIG. 5A and FIG. 5B, another sample was made wherein the grooves were formed to run radially from the through hole. This example produced substantially the same result as that of example 1.

The present invention has been described with respect to a specific embodiment. However, other embodiments based on the principles of the present invention should be obvious to those of ordinary skill in the art. Such embodiments are intended to be covered by the claims.

What is claimed is:

1. A joined ceramic-metal composite substrate comprising a ceramic substrate having opposite surfaces and a copper sheet having a face directly joined to one of the surfaces of the ceramic substrate, at least one through hole in the copper sheet, and at least one groove on a portion of the face of the copper sheet, the face including a groove-free marginal area completely surrounding said portion.

2. The joined ceramic-metal composite substrate according to claim 1 wherein the through hole is cylindrical and has a diameter in the range of 0.02 mm to 1 mm.

3. The joined ceramic-metal composite substrate according to claim 1 wherein the groove terminates at least 1 mm from the periphery of the face.

4. The joined ceramic-metal composite substrate according to claim 1 wherein the groove has a width in a range of 0.5 mm to 1 mm.

5. The joined ceramic-metal composite substrate according to claim 1 wherein the groove has a depth in a range of 0.02 mm $-0.008$ mm.

6. The joined ceramic-metal composite substrate according to claim 1 wherein the composite substrate includes a plurality of parallel grooves.

7. The joined ceramic-metal composite substrate according to claim 6 wherein the distance between center lines of adjacent grooves is in a range of 1 mm to 25 mm.

8. The joined ceramic-metal composite substrate according to claim 1 wherein the composite substrate includes a plurality of grooves radially extending from the through hole.

9. A method for producing a ceramic-metal composite substrate comprising the steps of:
    forming at least one groove on a face of a copper circuit board with a groove-free marginal area completely surrounding the face; forming at least one hole through the board and extending into the groove; and heat bonding the face of the board to a ceramic substrate, said groove having a width in a range of 0.01 mm to 3 mm and a maximum depth of the lesser of 0.1 mm and one half the thickness of the copper sheet.

10. The joined ceramic-metal composite substrate according to claim 1 wherein the ceramic substrate and the copper sheet have undergone heat treatment and said at least one groove on the face of the copper sheet has substantially collapsed through recovery of plastic deformation against the surface of this ceramic substrate.

11. The method according to claim 9, wherein the heat bonding step includes superimposing the copper circuit board on the ceramic substrate, heating the circuit board and substrate to a temperature in the range of 1,065 to 1,083° C., joining the circuit board and the substrate by eutectic reaction, and causing said at least one groove to substantially collapse against the surface of said ceramic substrate through recovery of plastic deformation.

* * * * *

UNITED STATES PATENT AND TRADEMARK OFFICE
CERTIFICATE OF CORRECTION

PATENT NO. : 4,954,386
DATED : September 04, 1990
INVENTOR(S) : Nobuyuki Mizunoya et al.

It is certified that error appears in the above-identified patent and that said Letters Patent is hereby corrected as shown below:

Claim 1, Column 5, Line 37 "portion" should be followed by
--said grove having a width in a range of 0.01 mm to 3 mm and a maximum depth of the lesser of 0.1 mm and one half the thickness of the copper sheet--.

Claim 5, Column 6, Line 6, "0.008" should be -0.08--.

Signed and Sealed this

Eleventh Day of August, 1992

Attest:

DOUGLAS B. COMER

*Attesting Officer*      *Acting Commissioner of Patents and Trademarks*